(12) United States Patent
Oh et al.

(10) Patent No.: US 12,506,110 B2
(45) Date of Patent: Dec. 23, 2025

(54) SOLDER REFLOW APPARATUS AND METHOD OF MANUFACTURING ELECTRONIC DEVICE

(71) Applicant: Samsung Electronics Co., Ltd., Suwon-si (KR)

(72) Inventors: Seungyeop Oh, Suwon-si (KR); Youngja Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1 day.

(21) Appl. No.: 18/588,268

(22) Filed: Feb. 27, 2024

(65) Prior Publication Data

US 2024/0363579 A1    Oct. 31, 2024

(30) Foreign Application Priority Data

Apr. 26, 2023    (KR) .................. 10-2023-0054460

(51) Int. Cl.
| | |
|---|---|
| *H01L 23/00* | (2006.01) |
| *B23K 1/012* | (2006.01) |
| *B23K 3/047* | (2006.01) |
| *B23K 3/08* | (2006.01) |
| *B23K 101/40* | (2006.01) |
| *H01L 23/31* | (2006.01) |

(52) U.S. Cl.
CPC .............. *H01L 24/75* (2013.01); *B23K 1/012* (2013.01); *B23K 3/0471* (2013.01); *B23K 3/087* (2013.01); *H01L 24/16* (2013.01); *H01L 24/81* (2013.01); *B23K 2101/40* (2018.08); *H01L 23/3121* (2013.01); *H01L 2224/16227* (2013.01); *H01L 2224/75272* (2013.01); *H01L 2224/75651* (2013.01); *H01L 2224/75652* (2013.01); *H01L 2224/81815* (2013.01)

(58) Field of Classification Search
None
See application file for complete search history.

(56) References Cited

U.S. PATENT DOCUMENTS

| | | | | |
|---|---|---|---|---|
| 4,321,031 A | * | 3/1982 | Woodgate | B23K 1/015 392/394 |
| 4,558,524 A | * | 12/1985 | Peck | H01L 21/67034 134/104.4 |
| 4,610,886 A | * | 9/1986 | Buller-Colthurst | A47J 37/044 426/523 |

(Continued)

*Primary Examiner* — Devang R Patel
(74) *Attorney, Agent, or Firm* — HARNESS, DICKEY & PIERCE, P.L.C.

(57) ABSTRACT

A solder reflow apparatus may include a vapor generating chamber configured to accommodate a heat transfer fluid, a heater configured to heat the heat transfer fluid, a vertical transfer portion, and at least one substrate stage. The vertical transfer portion may include a vertical conveyor supported by a driving pulley and a driven pulley so as to be rotatable in an endless track, the vertical conveyor having a conveying route of a descending path and an ascending path in the vapor generating chamber, and at least one substrate stage fixedly fastened to one side of the vertical conveyor by a fastening portion so as to be raised and lowered in the vapor generating chamber by rotation of the vertical conveyor. The at least one substrate stage may be configured to support a substrate on which an electronic component may be mounted via a solder.

20 Claims, 14 Drawing Sheets

(56) References Cited

U.S. PATENT DOCUMENTS

| | | | |
|---|---|---|---|
| 4,838,476 A | 6/1989 | Rahn | |
| 4,840,305 A | 6/1989 | Ankrom et al. | |
| 4,964,498 A * | 10/1990 | Klingl | B65G 47/5113 198/347.1 |
| 5,030,809 A * | 7/1991 | Buday | A21B 1/42 219/400 |
| 5,038,496 A | 8/1991 | Mishina et al. | |
| 5,482,201 A | 1/1996 | Leicht | |
| 5,568,802 A * | 10/1996 | Buday | A21B 1/50 99/476 |
| 6,649,878 B2 * | 11/2003 | Rehm | F26B 15/10 198/435 |
| 6,732,911 B2 | 5/2004 | Matsuki et al. | |
| 7,380,699 B2 | 6/2008 | Dokkedahl | |
| 7,748,600 B2 * | 7/2010 | Leicht | B23K 1/015 228/221 |
| 2024/0355640 A1 * | 10/2024 | Kim | H01L 21/4853 |

* cited by examiner

SOLDER REFLOW APPARATUS AND METHOD OF MANUFACTURING ELECTRONIC DEVICE

PRIORITY STATEMENT

This application claims priority under 35 U.S.C. § 119 to Korean Patent Application No. 10-2023-0054460, filed on Apr. 26, 2023 in the Korean Intellectual Property Office (KIPO), the contents of which are herein incorporated by reference in their entirety.

BACKGROUND

1. Field

Example embodiments relate to a solder reflow apparatus and a method of manufacturing an electronic device using the same. More particularly, example embodiments relate to a solder reflow apparatus using a vapor phase soldering method and a method of manufacturing a semiconductor package using the same.

2. Description of the Related Art

A convection reflow method, a laser assisted bonding method, a vapor phase soldering method, or the like may be used to solder a solder paste in the field of surface mount technology (SMT). For the vapor phase soldering method, it may be possible to provide a uniform temperature distribution over the entire substrate, such as a printed circuit board (PCB), during the saturation of vapor inside an oven. For the vapor phase soldering method, the boiling point of a heat transfer fluid may depend on the heat transfer fluid used and overheating may be limited by setting the target temperature high. However, because a material plate for supporting the substrate is moved up and down by an elevating actuator, such as an arm or a transfer rod inside the oven, and is moved after stopping at a specific height for a certain period of time, continuous material input may not be possible. Thus, the number of workable substrates at one process in the oven is reduced to one. Accordingly, the production per unit hour (UPEH) for the vapor phase soldering method may be lower compared to the mass convection reflow method.

SUMMARY

Example embodiments provide a solder reflow apparatus capable of improving productivity.

Example embodiments provide a method of manufacturing an electronic device using the above solder reflow apparatus.

According to example embodiments, a solder reflow apparatus may include a vapor generating chamber configured to accommodate a heat transfer fluid and to be filled with saturated vapor generated when the heat transfer fluid is heated; a heater configured to heat the heat transfer fluid accommodated within the vapor generating chamber; a vertical transfer portion including a vertical transfer portion including a vertical conveyor supported by a driving pulley and a driven pulley so as to be rotatable in an endless track, the vertical conveyor having a conveying route of a descending path and an ascending path in the vapor generating chamber; and at least one substrate stage fixedly fastened to one side of the vertical conveyor by a fastening portion so as to be raised and lowered in the vapor generating chamber by rotation of the vertical conveyor, the at least one substrate stage being configured to support a substrate on which an electronic component is mounted via a solder.

According to example embodiments, a solder reflow apparatus may include a vapor generating chamber configured to accommodate a heat transfer fluid on a bottom thereof; a heater configured to heat the heat transfer fluid to generate saturated vapor from the heat transfer fluid; at least one substrate stage configured to support a substrate having an electronic device mounted thereon via a solder; a vertical transfer portion including a vertical conveyor supported by a driving pulley and a driven pulley so as to be rotatable in an endless track and have a conveying route including a descending path and an ascending path in the vapor generating chamber; and a fastening portion configured to fixedly fasten the at least one substrate stage to one side of the vertical conveyor.

According to example embodiments, a solder reflow apparatus may include a vapor generating chamber configured to accommodate a heat transfer fluid and a distribution of saturated vapor generated from the heat transfer fluid according to a density difference when the heat transfer fluid is heated; a heater configured to heat the heat transfer fluid accommodated within the vapor generating chamber; a vertical conveyor having a conveying route including a descending path and an ascending path within the vapor generating chamber; and a plurality of substrate stages fixedly fastened to the vertical conveyor, the plurality of substrate stages being movable upward and downward in the vapor generating chamber along the conveying route of the vertical conveyor, the plurality of substrate stages being spaced apart from each other along an extending direction of the vertical conveyor. Each of the plurality of substrate stages may be configured to support a substrate on which an electronic component may be mounted via a solder.

According to example embodiments, a solder reflow apparatus may include a vertical conveyor having a conveying route of a descending path and an ascending path in a vapor generating chamber, and a plurality of substrate stages that may be fixedly fastened to the vertical conveyor and movable up and down in the vapor generating chamber along the conveying route of the vertical conveyor. The plurality of substrate stages may be spaced apart from each other along an extending direction of the vertical conveyor.

Accordingly, the plurality of substrate stages may be sequentially loaded into the vapor generating chamber through the vertical conveyor so that solder reflow processes are sequentially performed on products on the plurality of substrate stages. Thus, productivity may be increased according to work continuity.

Additionally, the solder reflow apparatus may further include a guide pulley that is configured to change at least one of the descending path, the ascending path and a lower turning path of the vertical conveyor. A soldering temperature profile within the vapor generating chamber may be controlled by changing the location of the guide pulley and adjusting the time for the substrate stage to pass through a specific temperature zone.

Accordingly, defects in a reflow process for solders arranged at a fine pitch may be reduced and bonding quality may be improved.

BRIEF DESCRIPTION OF THE DRAWINGS

Example embodiments will be more clearly understood from the following detailed description taken in conjunction with the accompanying drawings. FIGS. 1 to 18 represent non-limiting, example embodiments as described herein.

FIG. 1 is a cross-sectional view illustrating a solder reflow apparatus in accordance with example embodiments.

FIG. 2 is a side view illustrating the solder reflow apparatus of FIG. 1.

FIG. 3 is a perspective view illustrating a vertical conveyor with a substrate stage fixedly fastened thereto.

FIG. 4 is a perspective view illustrating a tilted state of the substrate stage in an unloading position of the vertical conveyor of FIG. 1.

FIG. 5 is a cross-sectional view illustrating a solder reflow apparatus in accordance with example embodiments.

FIG. 6 is a cross-sectional view illustrating a changed position of a guide pulley of FIG. 5.

FIG. 8 is a cross-sectional view illustrating a solder reflow apparatus in accordance with example embodiments.

FIG. 9 is a cross-sectional view illustrating a solder reflow apparatus in accordance with example embodiments.

FIG. 10 is a cross-sectional view illustrating a solder reflow apparatus in accordance with example embodiments.

FIG. 11 is a flowchart illustrating a method of manufacturing an electronic device in accordance with example embodiments.

FIGS. 12 to 18 are views illustrating a method of manufacturing an electronic device in accordance with example embodiments.

DETAILED DESCRIPTION OF EXAMPLE EMBODIMENTS

Hereinafter, example embodiments will be explained in detail with reference to the accompanying drawings.

Figure 1:
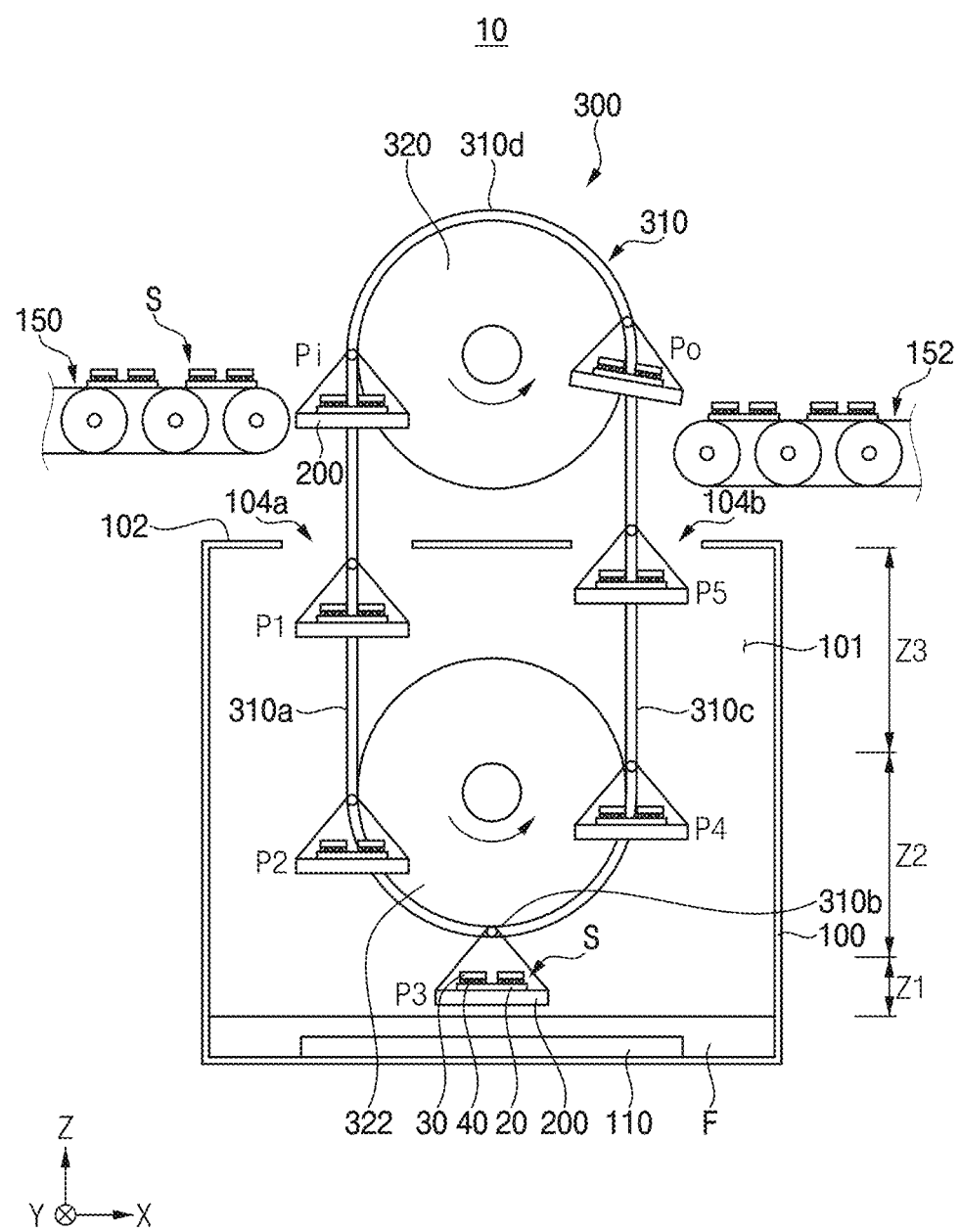
Figure 2:
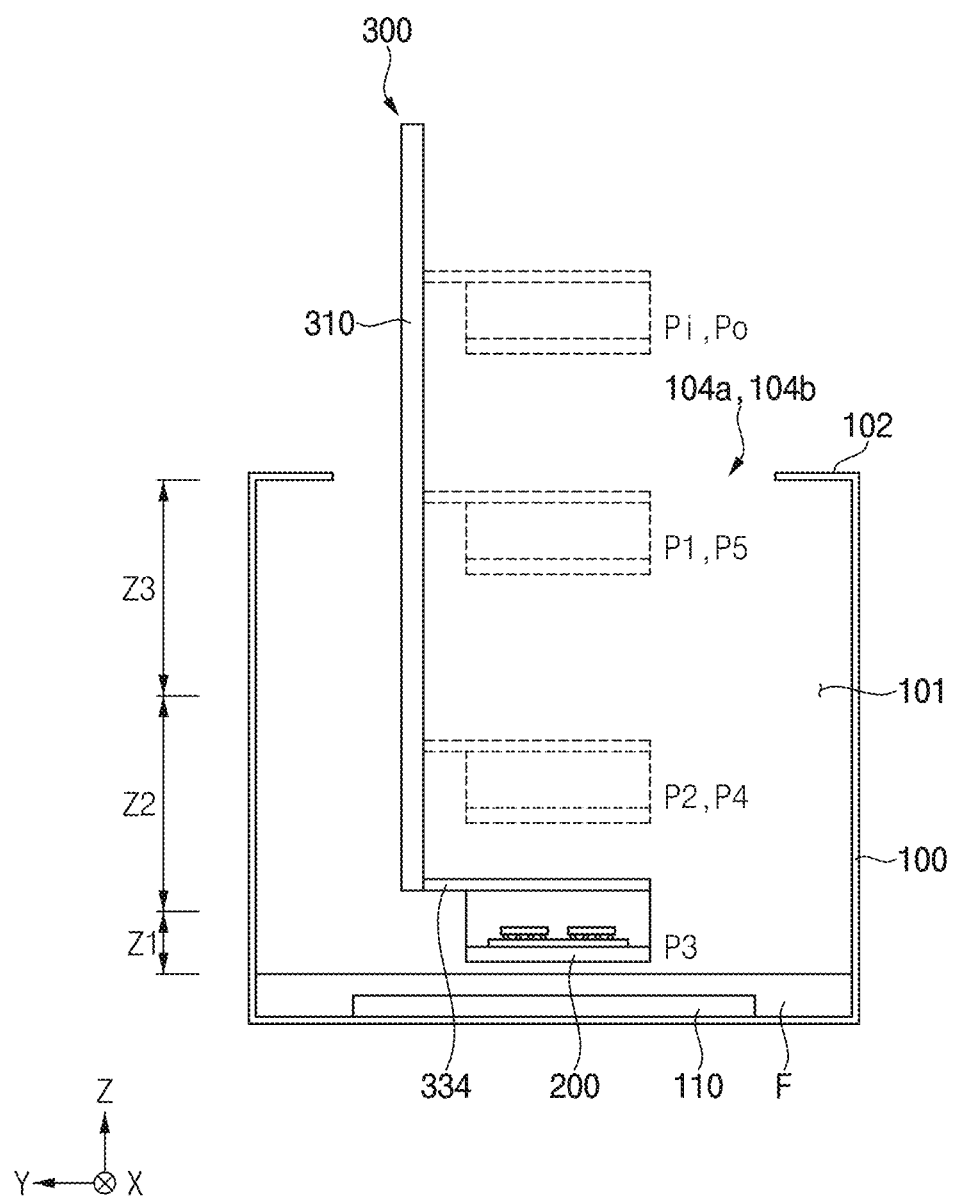
Figure 3:
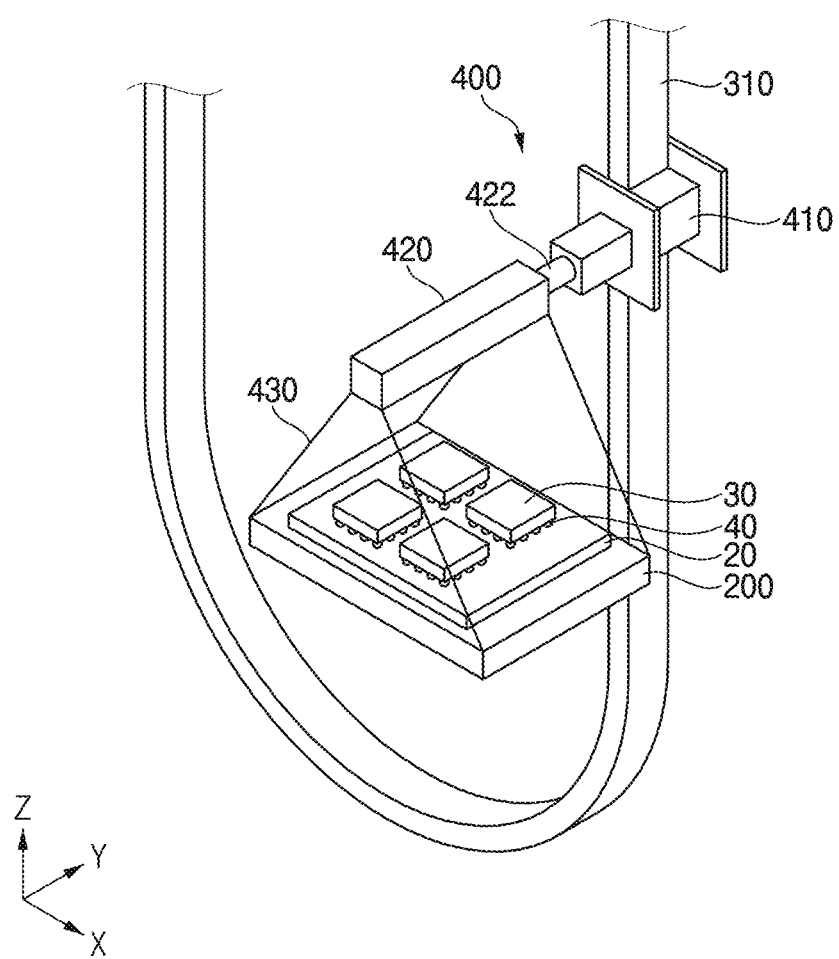
Figure 4:
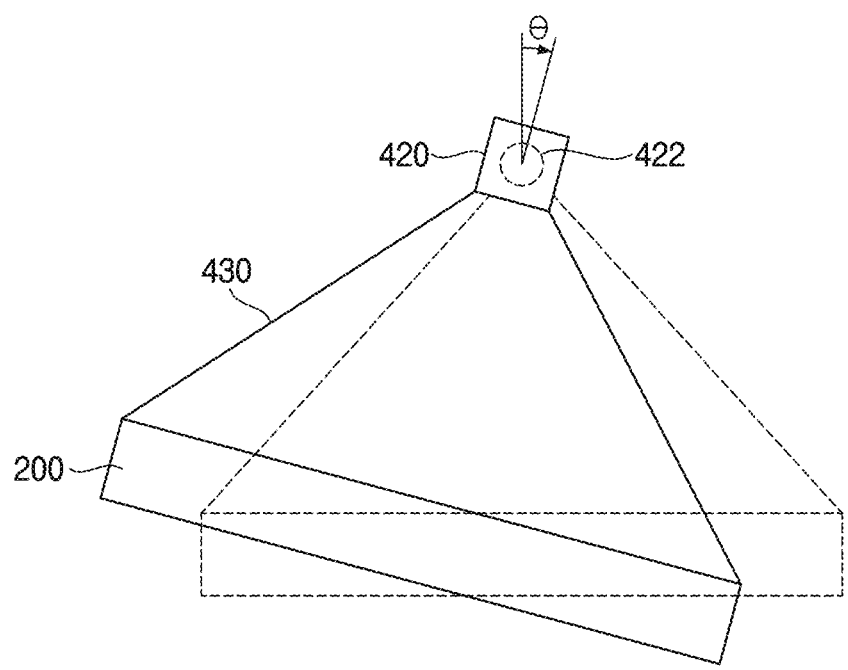

FIG. 1 is a cross-sectional view illustrating a solder reflow apparatus in accordance with example embodiments. FIG. 2 is a side view illustrating the solder reflow apparatus of FIG. 1. FIG. 3 is a perspective view illustrating a vertical conveyor with a substrate stage fixedly fastened thereto. FIG. 4 is a perspective view illustrating a tilted state of the substrate stage in an unloading position of the vertical conveyor of FIG. 1.

Referring to FIGS. 1 to 4, a solder reflow apparatus 10 may include a vapor generating chamber 100, a heater 110, at least one substrate stage 200, and a vertical transfer portion 300. In addition, the solder reflow apparatus 10 may further include a controller configured to control operations of the vertical transfer portion 300, a temperature sensing portion configured to monitor temperature in the vapor generating chamber 100, etc.

In example embodiments, the solder reflow apparatus 10 may be a vapor phase soldering apparatus configured to solder a solder paste using saturated vapor heated in the vapor generating chamber 100.

The vapor generating chamber 100 may include a lower reservoir having an oven shape to accommodate a heat transfer fluid F and to provide a space 101 filled with vapor, where the vapor may be generated directly above the fluid when the fluid F is boiling. The vapor generating chamber 100 may extend in a vertical direction (Z direction) by a desired and/or alternatively predetermined height. In the vapor generating chamber 100, the heat transfer fluid may boil and the vapor may rise to the top, condense back to the liquid state at the top, and flow back to the reservoir at the bottom.

The pressure inside the vapor generating chamber 100 may be maintained at atmospheric pressure. Alternatively, the vapor generating chamber 100 may be connected to an exhaust device, such as a vacuum pump, to adjust the pressure inside the vapor generating chamber 100. The pressure inside the vapor generating chamber may be maintained at a desired and/or alternatively predetermined pressure in order to change the boiling point of the heat transfer fluid and/or change the soldering environments.

The heat transfer fluid F may be a chemical material that is selected to provide the vapor necessary for vapor phase soldering. The heat transfer fluid may be selected in consideration of boiling point, environmental influences, and corrosiveness of the generated vapor. The heat transfer fluid may include an inert organic liquid. For example, the heat transfer fluid may include a perfluoropolyether (PFPEs)-based GALDEN® solution. The boiling point of the GALDEN® solution may be 230° C.

The heater 110 may heat the heat transfer fluid F accommodated in the vapor generating chamber 100 to generate saturated vapors. The heater 110 may include an electrical resistor that is immersed in the heat transfer fluid F on the bottom of the vapor generating chamber 100. Alternatively, the heater 110 may include a resistor in the form of a coil surrounding the reservoir tank.

In addition, a heater (not illustrated) as a portion of a temperature control mechanism may be installed on a sidewall of the vapor generating chamber 100 to control the temperature of the vapor generating chamber 100 during a reflow process.

The substrate stage 200 may support an article S on which a solder process is performed in the vapor generating chamber 100. The substrate stage 200 may include a mesh type or a fork type support structure for supporting the article S. The mesh type support structure may include support wires that define a plurality of openings through which the vapor moves. The fork type support structure may include a plurality of rods that are spaced apart from each other to form a fork shape. For example, the article S may include a substrate 20 on which an electronic component 30 is mounted via a solder 40.

In example embodiments, the vertical transfer portion 300 may move the at least one substrate stage 200 upward and downward within the vapor generating chamber 100. The vertical transfer portion 300 may include a vertical conveyor 310 that is disposed vertically in the vapor generating chamber 100 and rotates in an endless track. An endless track may be a route without a first end and a second end opposing each other, such as a loop track or other track without opposite ends spaced apart from each other. The substrate stage 200 may be fixedly fastened to the vertical conveyor 310 by a fastening portion 400 and may move upward and downward in the vapor generating chamber 100 by rotation of the vertical conveyor 310.

In particular, the vertical transfer portion 300 may include the vertical conveyor 310 and a driving pulley 320 and a driven pulley 322 that are rotatable to support the vertical conveyor 310. The vertical transfer portion 300 may include a frame that extends in a vertical direction, and the driving pulley 320 and the driven pulley 322 may be installed at upper and lower end portions of the frame, respectively. The driving pulley 320 may be rotated by a driver such as a motor, and power of the driving pulley 320 may be transmitted to the vertical conveyor 310.

The vertical conveyor 310 may include an annular chain, a belt, a cable, a rope, or the like that orbitally moves in the vertical direction. A conveying route of the vertical conveyor 310 may include a descending path 310a that extends vertically downward from the driving pulley 320 to the driven pulley 322, an ascending path that extends vertically upward from the driven pulley 322 to the driving pulley 320, a lower turning path 310b that transitions from the descending path 310a to the ascending path 310c, and an upper turning path 310d that transitions from the ascending path 310c to the descending path 310a.

An upper wall 102 of the vapor generating chamber 100 may have a first passage hole 104a and a second passage hole 104b that are spaced apart from each other. The first through hole 104a and the second through hole 104b may be spaced apart from each other in a first horizontal direction (X direction) perpendicular to the vertical direction (Z direction). The vertical conveyor 310 and the substrate stage 200 may be allowed to pass through the first and second passage holes 104a and 104b. The vertical conveyor 310 moving along the descending path 310a from the driving pulley 320 and the substrate stage 200 fastened to the vertical conveyor 310 may enter the vapor generating chamber 100 through the first passage hole 104a. The vertical conveyor 310 moving along the ascending path 310c and the substrate stage 200 fastened to the vertical conveyor 310 may pass through the second passage hole 104b from the vapor generating chamber 100 to the outside.

As illustrated in FIG. 3, the substrate stage 200 may be fixedly fastened to one side of the vertical conveyor 310 by the fastening portion 400. For example, the fastening portion 400 may include a coupler 410 fixedly installed on the vertical conveyor 310 and a support shaft 420 extending from the coupler 410 in a second horizontal direction (Y direction) perpendicular to the first horizontal direction. The support shaft 420 may be coupled to one side of the coupler 410 by a connecting shaft 422. The substrate stage 200 may be engaged and supported by support rods 430 that extend from the support shaft 420 to the substrate stage 200. When the substrate stage 200 moves up and down by the rotation of the vertical conveyor 310, the support shaft 420 of the fastening portion 400 may hold the substrate stage 200 such that the substrate stage 200 is maintained in a horizontal state.

A configuration in which the vertical conveyor rotates in an endless track and the substrate stage fixedly fastened to the vertical conveyor moves up and down has been described as an example, but example embodiments are not limited thereto.

In another embodiment, the vertical conveyor 310 may be fixedly supported by support rollers similar to the driving pulley 320 and the driven pulley 322, and the substrate stage 200 may be coupled to be movable along the vertical conveyor 310 by a fastener similar to the fastening portion 400. In this case, the coupler 410 may be installed to be movable along the vertical conveyor 310.

As illustrated in FIG. 4, the support shaft 420 may be rotatable by a desired and/or alternatively predetermined angle θ with respect to a central axis thereof. The connecting shaft 422 may be connected to a driving shaft of a geared motor provided on one side of the coupler 410. As the connecting shaft 422 rotates by a desired and/or alternatively predetermined angle θ by the geared motor, the support shaft 420 fixedly coupled to the connecting shaft 422 may also rotate by a desired and/or alternatively predetermined angle θ. When the support shaft 420 rotates by a desired and/or alternatively predetermined angle θ, the substrate stage 200 may be tilted by a preset angle θ with respect to a horizontal direction (XY plane).

As will be described below, in the unloading position of the vertical conveyor 310, the support shaft 420 may rotate by a desired and/or alternatively predetermined angle θ with respect to the central axis, and accordingly, the substrate stage 200 may be tilted with respect to the horizontal direction (XY plane). In such a tilted state of the substrate stage 200, the article S on the substrate stage 200 may be unloaded.

As illustrated in FIG. 1, in example embodiments, the solder reflow apparatus 10 may include a first horizontal conveyor 150 for loading the substrate 20 onto the substrate stage 200 on the descending path 310a of the vertical conveyor 310 and a second horizontal conveyor 152 for unloading the substrate 20 from the substrate stage 200 on the ascending path 310c of the vertical conveyor 310.

The first horizontal conveyor 150 and the second horizontal conveyor 152 may extend in a first horizontal direction (X direction) perpendicular to the vertical direction (Z direction). The first horizontal conveyor 150 may be located above the first passage hole 104a of the upper wall 112 of the vapor generating chamber 100. The second horizontal conveyor 152 may be located above the second passage hole 104b of the upper wall 112 of the vapor generating chamber 100. The first horizontal conveyor 150 may be installed at a higher position than the second horizontal conveyor 152. Alternatively, the first horizontal conveyor 150 and the second horizontal conveyor 152 may be installed at the same height or the second horizontal conveyor 152 may be installed at a higher position than the first horizontal conveyor 150.

An article S for soldering may be loaded onto the substrate stage 200 in a loading position Pi of the descending path 310a of the vertical conveyor 310 by the first horizontal conveyor 150. The first horizontal conveyor 150 may transfer the article S above the first passage hole 104a of the upper wall 112 of the vapor generating chamber 100, and the article S may be loaded on the substrate stage 200 by a transfer mechanism 104 such as a guide rail or a transport pusher.

After the article S is loaded, the GALDEN® solution (e.g., perfluoropolyether (PFPEs)-based solution) F may be heated by the heater 110 and start to boil. The saturated vapor from the GALDEN® solution (e.g., perfluoropolyether (PFPEs)-based solution) may be distributed within the space 101 of the vapor generating chamber 100. At this time, the density of the saturated vapor may vary depending on the height, and thus a temperature gradient may be formed.

In example embodiments, the vapor generating chamber 100 may be divided into a first zone Z1, a second zone Z2, and a third zone Z3 according to the height. The third zone Z3, which is the highest space, may be maintained at a first temperature T1. The second zone Z2 may be maintained at a second temperature T2, which may be higher than the first temperature T1. The first zone Z1, which is the lowest space, may be maintained at a third temperature T3, which may be higher than the second temperature T2. The temperatures in the first to third zones may be determined in proportion to the vapor densities in each zone.

For example, the temperature T1 may be 100° C., the temperature T2 may be 170° C., and the temperature T3 may be 230° C. The temperatures in the first to third zones may be determined in consideration of a temperature profile of soldering. The solder 40 may include Sn—Ag—Cu (SAC)

solder, Sn—Ag solder, etc. Since the boiling point of the SAC solder is 217° C., the temperature T3 at the first zone Z1, which is a reflow section, may be maintained at 230° C.

During the solder reflow process, the article S may be moved to a first position P1 and a second position P2 of the descending path 310a, a third position P3 of the lower turning path 310b, and a fourth position P4 and a fifth position P5 of the ascending path 310c by the rotation of the vertical conveyor 310. Accordingly, the article S may obtain a soldering temperature profile corresponding to the temperature distribution of the first to third zones. A desired soldering temperature profile may be obtained while the article S on the substrate stage 200 moves through the first to third zones Z1, Z2 and Z3 with time.

In particular, after the article S is preheated in the third zone Z3, the article may be moved to the second zone Z2 and activated (e.g., soaked). The substrate 20 may be preheated to limit and/or prevent various soldering defects and to provide a more solid and conductive joint. There may be a secondary vapor phase which is produced at a cooler temperature than the main vapor layer in the third and second zones Z3 and Z2. No soldering takes place in this zone, only a temperature rises.

Then, the article S may be moved to the first zone Z1 so that the solder 40 may be reflowed. When the article S is immersed in the vapor in the first zone Z1, the vapor may serve as a heat transfer medium. Since the temperature of the vapor and the temperature of the substrate 20 in the first zone Z1 are different from each other, vapor may condense on a surface of the article S to form a layer. The vapor condensing on the surface may transfer latent heat to the surface of the substrate 20 during condensation to reflow a solder paste.

Then, after the solder 40 is soldered, the article S may be moved to the second zone Z2 and the third zone Z3 and then may be cooled. Accordingly, the solder joints may be cooled down and solidified.

The soldered article S may be moved upward to the unloading position Po of the ascending path 310c of the vertical conveyor 310, and the article S on the substrate stage 200 at the unloading position Po may be unloaded onto the second horizontal conveyors 152. At this time, the support shaft 420 may be rotated by a desired and/or alternatively predetermined angle θ with respect to the central axis and the substrate stage 200 may be tilted with respect to the horizontal direction (XY plane). In the tilted state of the substrate stage 200, the article S on the substrate stage 200 may be unloaded onto the second horizontal conveyor 152 that is positioned below the substrate stage 200.

In example embodiments, a plurality of substrate stages 200 may be fixedly coupled to the vertical conveyor 310. The plurality of substrate stages 200 may be spaced apart from each other along the extending direction of the vertical conveyor 310.

The plurality of substrate stages 200 may be sequentially loaded into the vapor generating chamber 100 through the vertical conveyor 310 so that solder reflow processes may be sequentially performed on the plurality of substrate stages 200. For example, several to several tens (e.g., 3 to 70, 3 to 30) of substrate stages 200 may sequentially enter and move within the vapor generating chamber 100.

Figure 5:
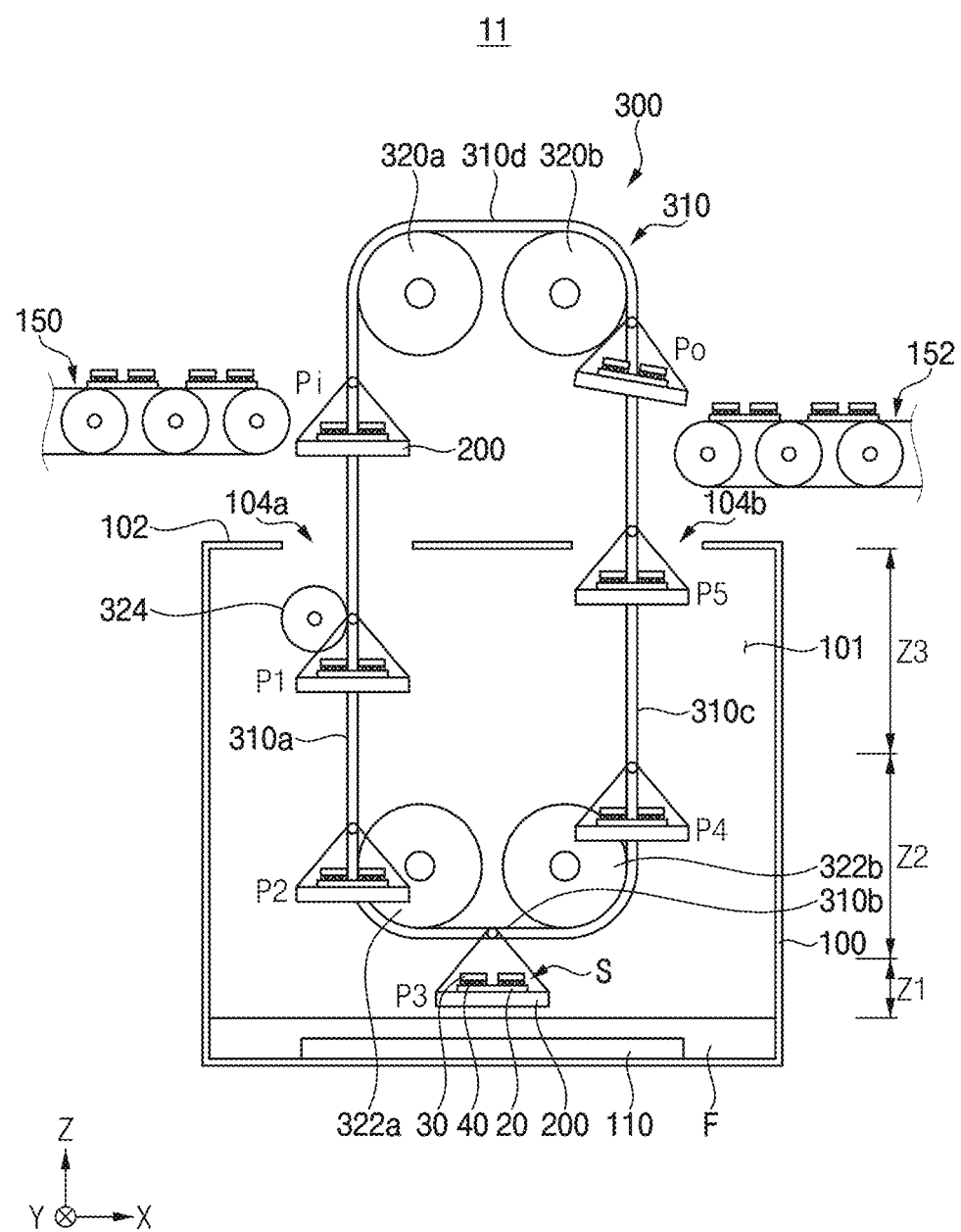
Figure 6:
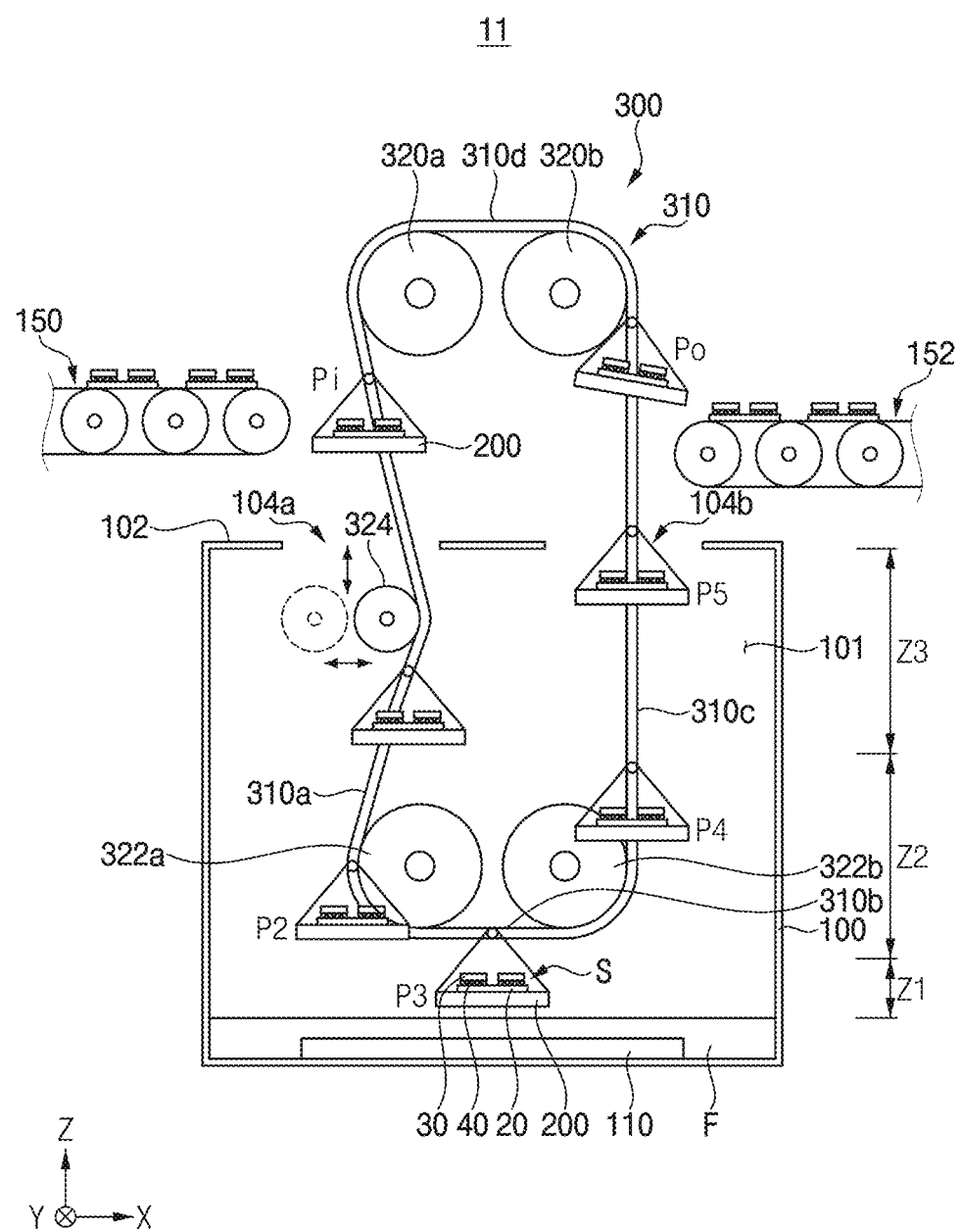
Figure 7A:
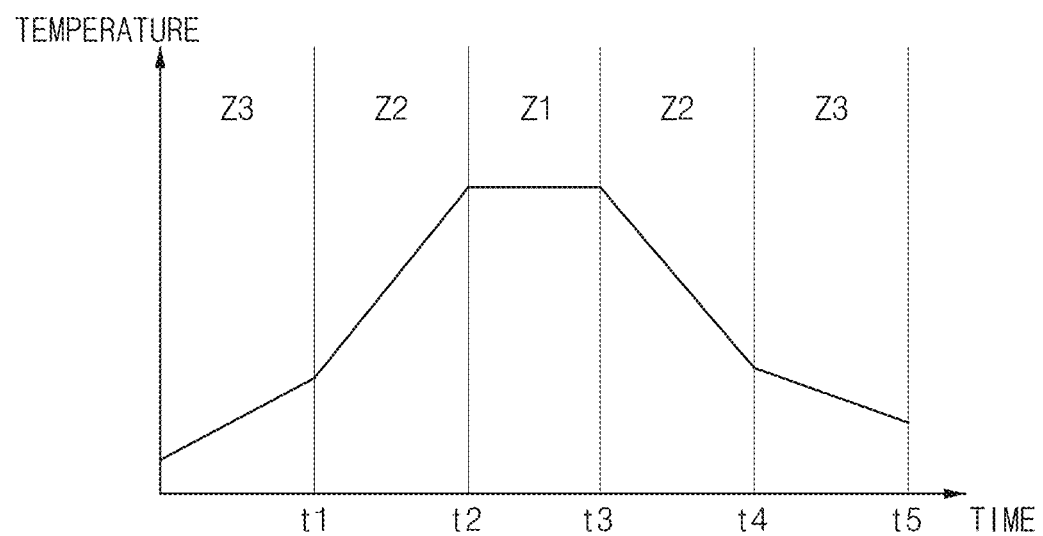
FIG. 7A is a graph illustrating a soldering temperature profile over time in a vapor generating chamber of the solder reflow apparatus in FIG. 5.
Figure 7B:
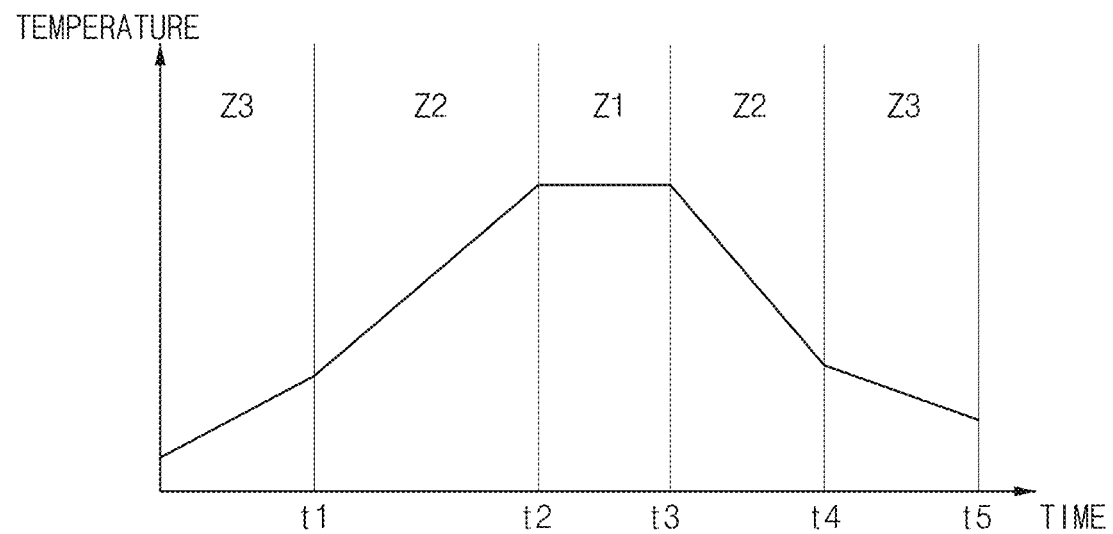
FIG. 7B is a graph illustrating a soldering temperature over time in a vapor generating chamber of the solder reflow apparatus in FIG. 6.

FIG. 5 is a cross-sectional view illustrating a solder reflow apparatus in accordance with example embodiments. FIG. 6 is a cross-sectional view illustrating a changed position of a guide pulley of FIG. 5. FIG. 7A is a graph illustrating a soldering temperature profile over time in a vapor generating chamber of the solder reflow apparatus in FIG. 5, and FIG. 7B is a graph illustrating a soldering temperature over time in a vapor generating chamber of the solder reflow apparatus in FIG. 6. The solder reflow apparatus of FIG. 5 may be substantially the same as the solder reflow apparatus described with reference to FIGS. 1 and 2 except for an additional configuration of a vertical transfer portion. Thus, the same reference numerals may be used to refer to the same or like elements and any further repetitive explanation concerning the above elements will be omitted.

Referring to FIGS. 5 and 6, a vertical transfer portion 300 of a solder reflow apparatus 11 may include a vertical conveyor 310, and first and second driving pulleys 320a and 320b and first and second driven pulleys 322a and 322b that are rotatable to support the vertical conveyor 310. In addition, the vertical transfer portion 300 may further include a first guide pulley 324 that is configured to change a descending path of the vertical conveyor 310.

In example embodiments, the first and second driving pulleys 320a and 320b may be installed in an upper end portion of a frame, and the first and second driven pulleys 322a and 322b may be installed in a lower end portion of the frame. A length of a lower turning path 310b, transitioning from a descending path 310a to an ascending path 310c, may be changed according to diameters of the first and second driven pulleys 322a and 322b and a distance between the first and second driven pulleys 322a and 322b. As the length of the lower turning path 310b increases, the time required to pass through the first zone Z1 may increase, and accordingly, a reflow section may increase.

In example embodiments, the first guide pulley 324 may be installed rotatably to support a portion of the vertical conveyor 310 within a vapor generating chamber 100. The first guide pulley 324 may support the portion of the vertical conveyor 310 on the descending path 310a in a third zone Z3 or a second zone Z2 to change the descending path of the vertical conveyor 310.

As illustrated in FIG. 6, the first guide pulley 324 may be installed to be movable in a first horizontal direction (X direction) or vertical direction (Z direction) in the third zone Z3 or the second zone Z2.

FIG. 7A is a graph illustrating a soldering temperature profile over time in a case where the position of the first guide pulley located in the second zone is not varied to maintain an initial descending path, and FIG. 7B is a graph illustrating soldering temperature profile over time in case where the position of the first guide pulley located in the second zone is varied to change the initial descending path.

Referring to FIGS. 7A and 7B, as the first guide pulley 324 moves in the first horizontal direction (X direction), the time (t2-t1) required to pass through the second zone Z2 may become longer, and accordingly, the activation section may be lengthened.

Figure 8:
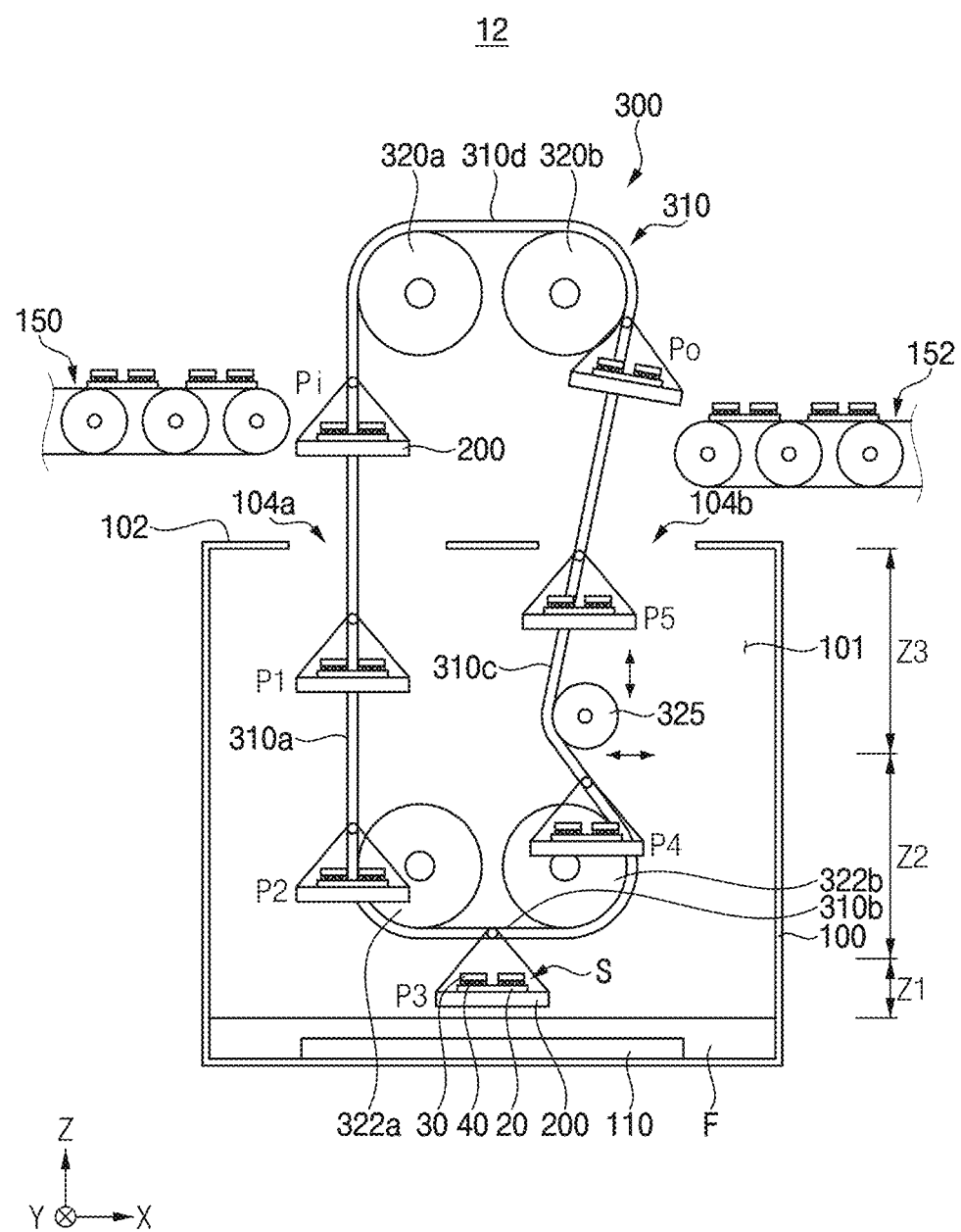

FIG. 8 is a cross-sectional view illustrating a solder reflow apparatus in accordance with example embodiments. The solder reflow apparatus may be substantially the same as the solder reflow apparatus described with reference to FIGS. 1 and 2 except for an additional configuration of a vertical transfer portion. Thus, the same reference numerals may be used to refer to the same or like elements and any further repetitive explanation concerning the above elements will be omitted.

Referring to FIG. 8, a vertical transfer portion 300 of a solder reflow apparatus 12 may include a vertical conveyor 310, and first and second driving pulleys 320a and 320b and first and second driven pulleys 322a and 322b that are rotatable to support the vertical conveyor 310. In addition, the vertical transfer portion 300 may further include a second guide pulley 325 that is configured to change an ascending path of the vertical conveyor 310.

In example embodiments, the first and second driving pulleys 320a and 320b may be installed in an upper end portion of a frame, and the first and second driven pulleys 322a and 322b may be installed in a lower end portion of the frame. A length of a lower turning path 310b, transitioning from a descending path 310a to an ascending path 310c, may be changed according to diameters of the first and second driven pulleys 322a and 322b and a distance between the first and second driven pulleys 322a and 322b. As the length of the lower turning path 310b increases, the time required to pass through the first zone Z1 may increase, and accordingly, a reflow section may increase.

In example embodiments, the second guide pulley 325 may be installed rotatably to support a portion of the vertical conveyor 310 within a vapor generating chamber 100. The second guide pulley 325 may support the portion of the vertical conveyor 310 on an ascending path 310c in a third zone Z3 or a second zone Z2 to change the ascending path of the vertical conveyor 310.

The second guide pulley 325 may be installed to be movable in a first horizontal direction (X direction) or vertical direction (Z direction) in the third zone Z3 or the second zone Z2. As the second guide pulley 325 moves in the first horizontal direction (X direction), the time required to pass through the second zone Z2 may become longer, and accordingly, a cooling section may be lengthened.

Figure 9:
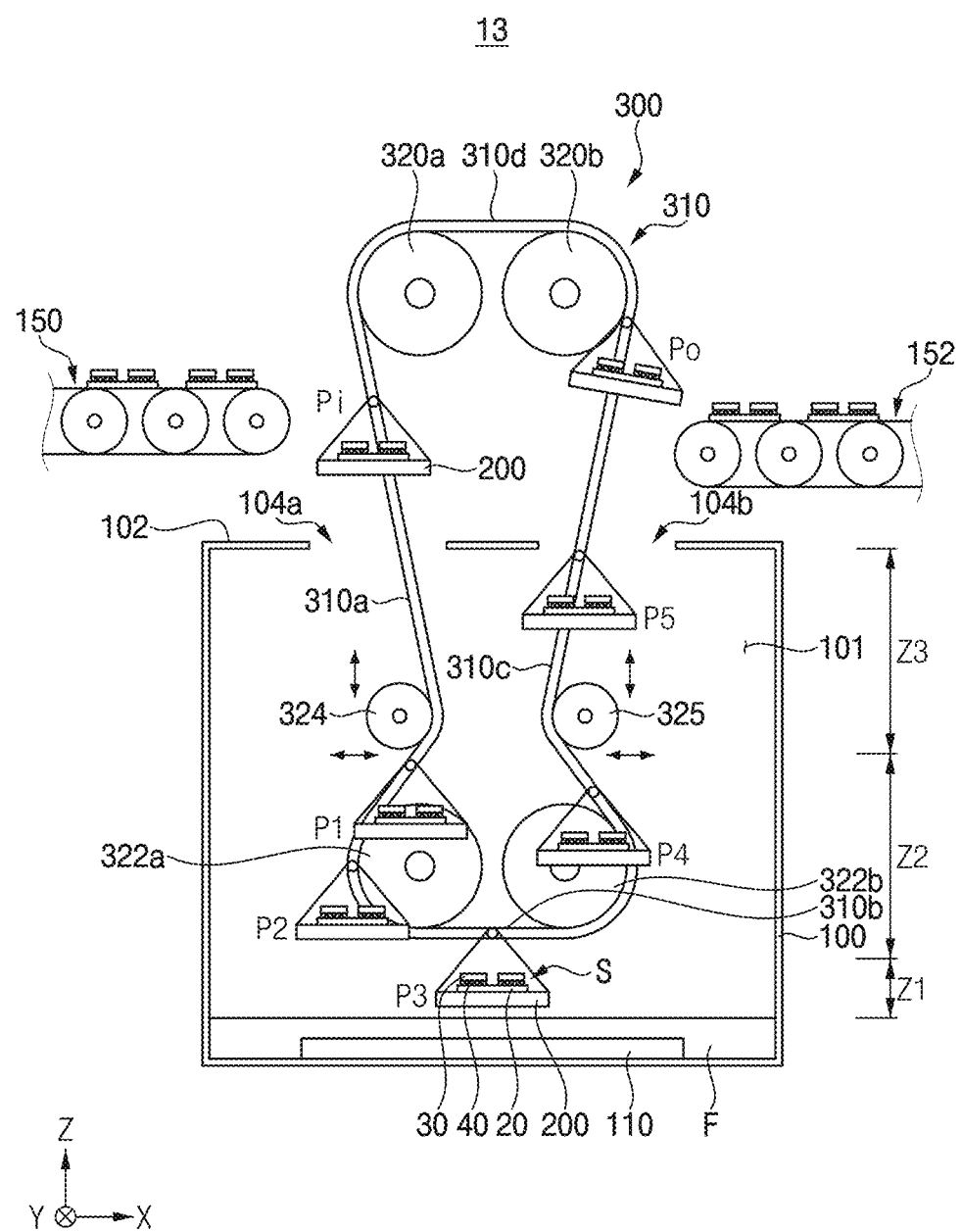

FIG. 9 is a cross-sectional view illustrating a solder reflow apparatus in accordance with example embodiments. The solder reflow apparatus may be substantially the same as the solder reflow apparatus described with reference to FIGS. 1 and 2 except for an additional configuration of a vertical transfer portion. Thus, the same reference numerals may be used to refer to the same or like elements and any further repetitive explanation concerning the above elements will be omitted.

Referring to FIG. 9, a vertical transfer portion 300 of a solder reflow apparatus 13 may include a vertical conveyor 310, and first and second driving pulleys 320a and 320b and first and second driven pulleys 322a and 322b that are rotatable to support the vertical conveyor 310. In addition, the vertical transfer portion 300 may further include a first guide pulley 324 that is configured to change a descending path of the vertical conveyor 310 and a second guide pulley 325 that is configured to change an ascending path of the vertical conveyor 310.

In example embodiments, the first guide pulley 324 may support a portion of the vertical conveyor 310 on a descending path 310a in a third zone Z3 or a second zone Z2 to change the descending path of the vertical conveyor 310. The first guide pulley 324 may be installed to be movable in a first horizontal direction (X direction) or vertical direction (Z direction) in the third zone Z3 or the second zone Z2. As the first guide pulley 324 moves in the first horizontal direction (X direction), the time required to pass through the second zone Z2 may become longer, and accordingly, an activation section may be lengthened.

In example embodiments, the second guide pulley 325 may support a portion of the vertical conveyor 310 on an ascending path 310c in a third zone Z3 or a second zone Z2 to change the ascending path of the vertical conveyor 310. The second guide pulley 325 may be installed to be movable in a first horizontal direction (X direction) or vertical direction (Z direction) in the third zone Z3 or the second zone Z2. As the second guide pulley 325 moves in the first horizontal direction (X direction), the time required to pass through the second zone Z2 may become longer, and accordingly, a cooling section may be lengthened.

Figure 10:
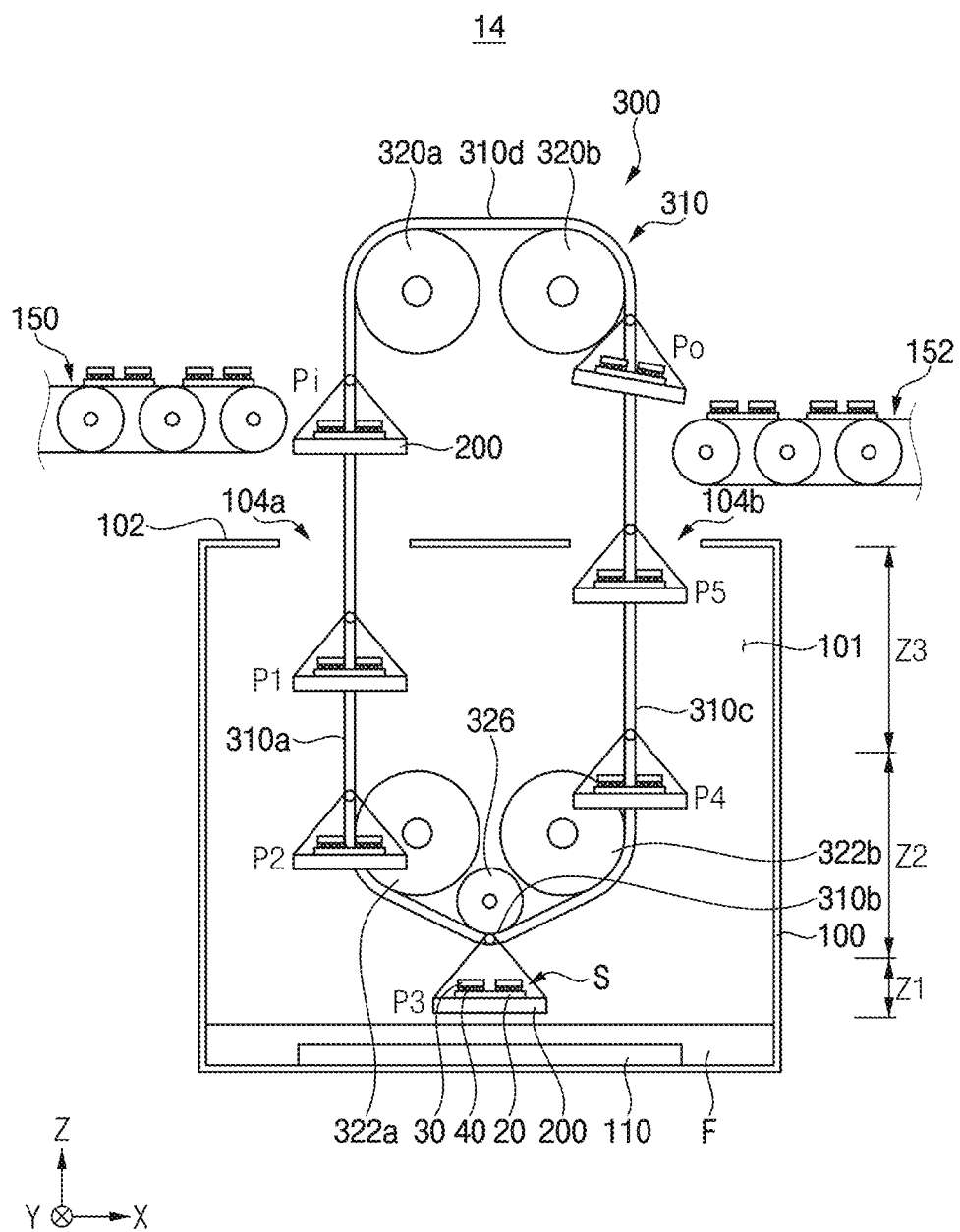

FIG. 10 is a cross-sectional view illustrating a solder reflow apparatus in accordance with example embodiments. The solder reflow apparatus may be substantially the same as the solder reflow apparatus described with reference to FIGS. 1 and 2 except for an additional configuration of a vertical transfer portion. Thus, the same reference numerals may be used to refer to the same or like elements and any further repetitive explanation concerning the above elements will be omitted.

Referring to FIG. 10, a vertical transfer portion 300 of a solder reflow apparatus 14 may include a vertical conveyor 310, and first and second driving pulleys 320a and 320b and first and second driven pulleys 322a and 322b that are rotatable to support the vertical conveyor 310. In addition, the vertical transfer portion 300 may further include a third guide pulley 326 that is configured to change a lower turning path of the vertical conveyor 310.

In example embodiments, the first and second driving pulleys 320a and 320b may be installed in an upper end portion of a frame, and the first and second driven pulleys 322a and 322b may be installed in a lower end portion of the frame. A length of a lower turning path 310b transitioning from a descending path 310a to an ascending path 310c may be changed according to diameters of the first and second driven pulleys 322a and 322b and a distance between the first and second driven pulleys 322a and 322b. As the length of the lower turning path 310b increases, the time required to pass through the first zone Z1 may increase, and accordingly, a reflow section may increase.

In example embodiments, the third guide pulley 326 may be installed rotatably to support a portion of the vertical conveyor 310 within a vapor generating chamber 100. The third guide pulley 326 may support the portion of the vertical conveyor 310 on the lower turning path 310b in a first zone Z1 to change the lower turning path of the vertical conveyor 310.

The third guide pulley 326 may be installed between the first and second driven pulleys 322a and 322b to be movable in a vertical downward direction. As the third guide pulley 326 moves in the vertical downward direction, the time required to pass through the first zone Z1 may become longer, and accordingly, a reflow section may be lengthened. In addition, as a height of the vertical conveyor 310 that moves along the lower turning path 310b is lowered, the peak temperature in the solder reflow process may be increased.

Hereinafter, a method of manufacturing an electronic device using the solder reflow apparatus of FIG. 1 will be described. A case in which the electronic device is a semiconductor package will be described. However, it will be understood that the manufacturing method of the electronic device in accordance with example embodiments is not limited thereto.

Figure 11:
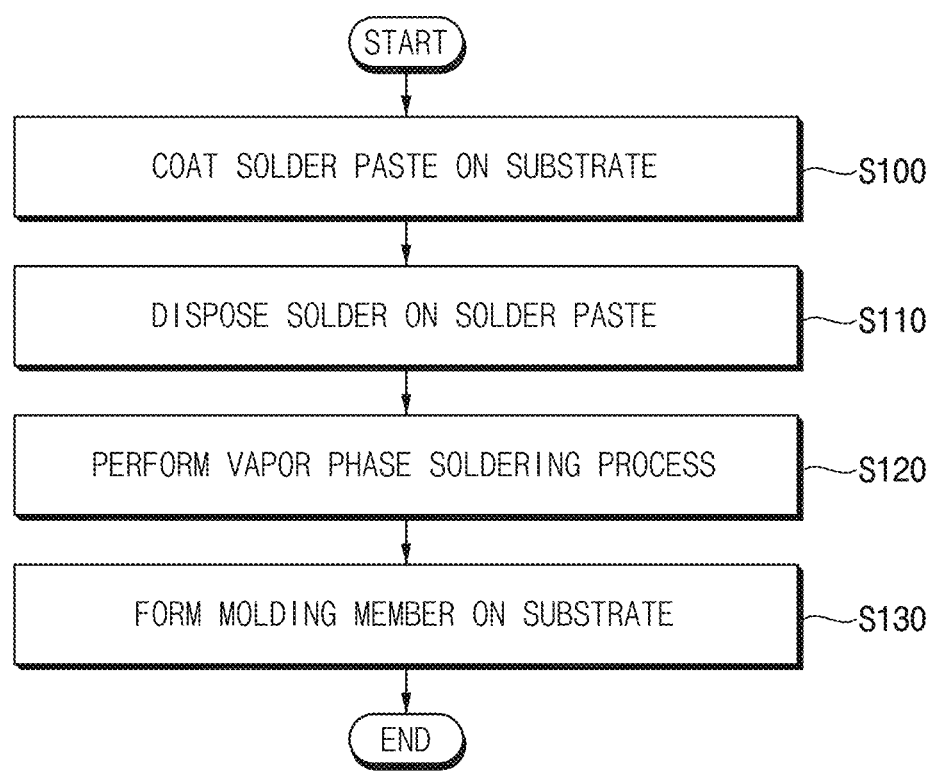
Figure 12:
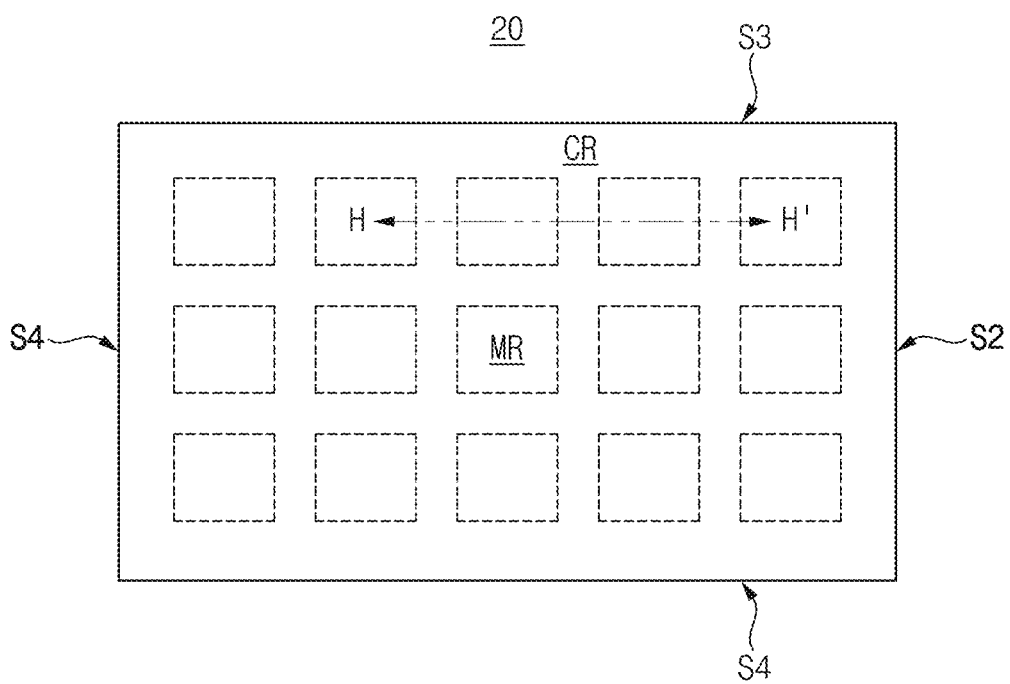
Figure 13:
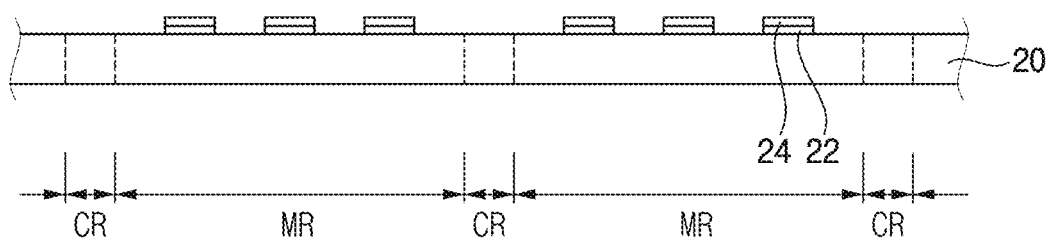

FIG. 11 is a flowchart illustrating a method of manufacturing an electronic device in accordance with example embodiments. FIGS. 12 to 18 are views illustrating a method of manufacturing an electronic device in accordance with example embodiments. FIG. 12 is a plan view illustrating a strip substrate on which semiconductor chips are mounted. FIGS. 13, 15 and 17 are cross-sectional views taken along the line A-A' in FIG. 12.

Referring to FIGS. 11 to 15, first, a substrate 20 having a plurality of substrate pads 22 formed thereon may be provided, a solder paste 24 may be coated on the plurality of substrate pads 22 of the substrate 20 (S100), and a solder 40 may be disposed on the solder paste 24 (S110).

As illustrated in FIG. 12, the substrate 20 may be a multilayer circuit board as a package substrate having an upper surface and a lower surface opposite to each other. The substrate 20 may be a strip substrate for manufacturing a semiconductor strip such as a printed circuit board (PCB).

The substrate 20 may have first and second side portions S1 and S2 extending in a direction parallel to a second direction perpendicular to the upper surface and facing each other, and third and fourth side portions S3 and S4 extending in a direction parallel to a first direction perpendicular to the second direction and facing each other. When viewed from a plan view, the substrate 20 may have a quadrangular shape. The substrate 20 may have a desired and/or alternatively predetermined area (e.g., 77.5 mm×240 mm).

The substrate 20 may include a mounting region MR on which an electronic component such as a semiconductor chip is mounted and a cutting region CR surrounding the mounting region MR. A plurality of semiconductor chips as the electronic components may be disposed on the mounting regions MR of the substrate 20 respectively. For example, tens to hundreds of semiconductor chips may be arranged in a matrix form on the substrate 20.

As illustrated in FIG. 13, tens to hundreds (e.g., 30 to 700, 30 to 500, 30 to 300) of semiconductor chips 30 may be arranged in a matrix form on the substrate 20. The semiconductor chips 30 may be respectively mounted on the first surface 21a of the substrate 20. For example, the semiconductor chips 30 may be mounted on the first surface 21a of the substrate 20 by a flip chip bonding method. The semiconductor chip 30 may be mounted on the first surface 21a of the substrate 20 via bumps 40. Alternatively, the semiconductor chip 30 may be attached to the first surface 21a of the substrate 20 by an adhesive film and electrically connected to the substrate 20 by bonding wires.

As illustrated in FIG. 13, the solder paste 24 may be coated on each of the plurality of substrate pads 22 of the substrate 20. A pitch between the substrate pads 22 of the substrate 20 may be within a range of several tens of microns.

The solder paste 24 may be printed onto the substrate pads 22 of substrate 20. For example, the solder paste 24 may be printed by a stencil printer. A stencil may be a metal foil having a plurality of openings corresponding to an array of solders that are subsequently placed. During printing, the solder paste 24 may be printed to fill the openings of the stencil. The solder paste 24 may include solder power and flux. The flux may include resin, solvent, activator, antioxidant, etc.

Alternatively, the solder paste may be coated to a surface of the solder 40 formed on the semiconductor chip.

Figure 14:
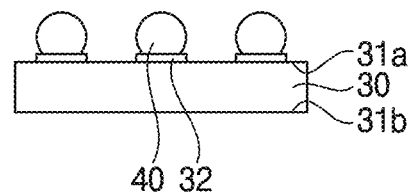
Figure 15:
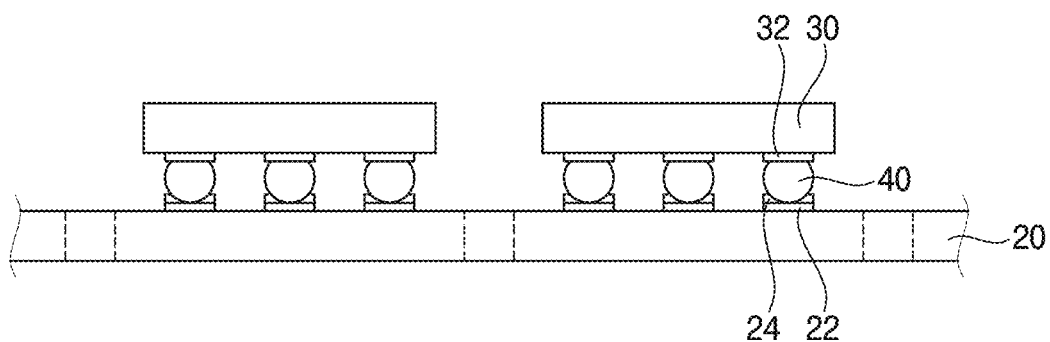

As illustrated in FIG. 14, the solder 40 may be formed on the electronic component 30 to be mounted on the substrate 20. The electronic component 30 may be a semiconductor chip. Alternatively, the electronic component may be a semiconductor package. In this case, the substrate 20 may be a module board.

A plurality of input/output pads 32 may be formed on a first surface 31a of the electronic component 30. The solders 40 may be respectively formed on the input/output pads 32. Although not illustrated in the figures, after forming an under bump metal (UBM) on the input/output pad 32, the solder 40 may be formed on the under bump metal.

As illustrated in FIG. 15, the electronic component 30 may be disposed on the substrate 20 such that the solder 40 is interposed between the input/output pad 32 of the electronic component 30 and the solder paste 24. The semiconductor chips may be mounted on the substrate 20 by a flip chip bonding method.

Then, a vapor phase reflow soldering may be performed (S120).

Figure 16:
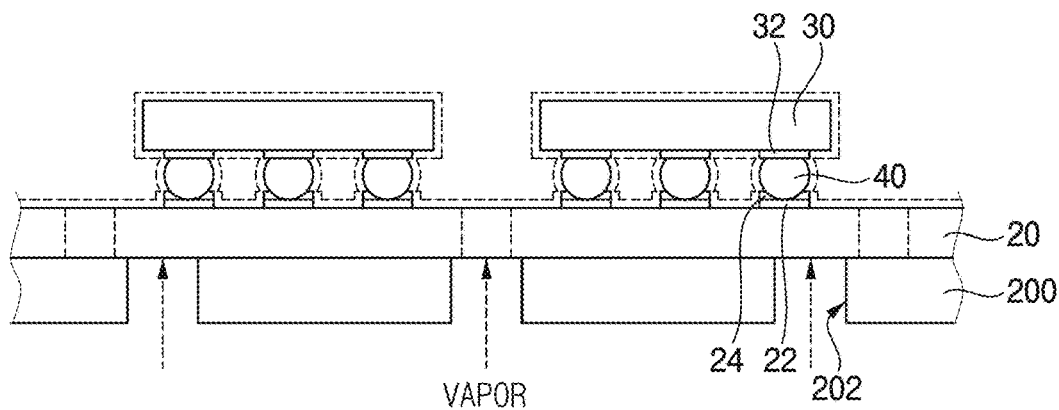
Figure 17:
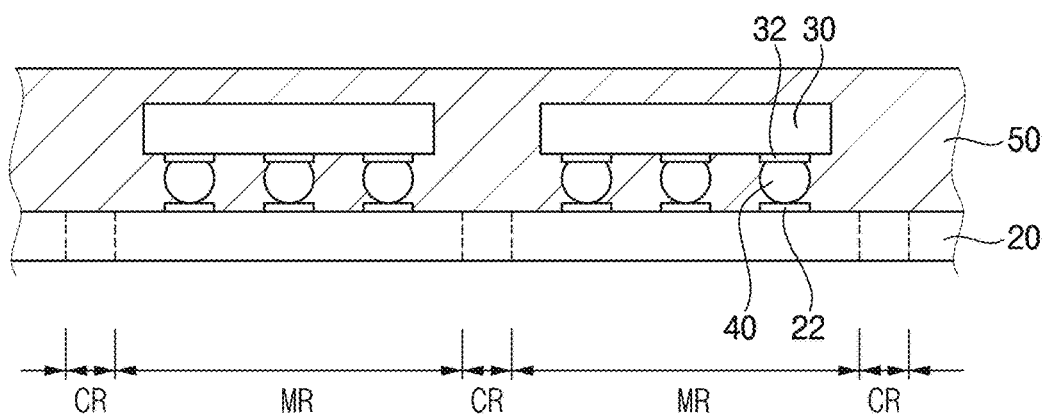

Referring to FIG. 16, the substrate 20 on which the electronic component 30 is mounted may be loaded into the vapor heating chamber 100 of the solder reflow apparatus 10 of FIG. 1, and while the substrate 20 is sequentially moved to the third, second and first zones Z3, Z2 and Z1 within the vapor generating chamber 100, the heat transfer fluid in a vapor state may be brought into contact with the surface of the substrate 20 to heat the solder paste 24, thereby reflowing the solder 40, and thus, a solder bump 40 may be formed between the substrate pad 22 and the input/output pad 32.

In example embodiments, a desired heating temperature profile over time may be implemented while moving the substrate through the vertically arranged first to third zones.

In particular, the substrate 20 may be loaded onto the substrate stage 200 in a loading position Pi of the descending path 310a of the vertical conveyor 310 by the first horizontal conveyor 150. After the substrate 20 is loaded, the GALDEN® solution (e.g., perfluoropolyether (PFPEs)-based solution) solution F may be heated by the heater 110 and start to boil. The saturated vapor from the GALDEN® solution (e.g., perfluoropolyether (PFPEs)-based solution) solution may be distributed within the space 101 of the vapor generating chamber 100. At this time, the density of the saturated vapor may vary depending on the height, and thus a temperature gradient may be formed.

Thus, the third zone Z3, which is the highest space, may be maintained at a first temperature T1, the second zone Z2 may be maintained at a second temperature T2 higher than the first temperature T1, and the first zone Z1, which is the lowest space, may be maintained at a third temperature T3 higher than the second temperature T2.

During the solder reflow process, the substrate 20 may be moved to a first position P1 and a second position P2 of the descending path 310a, a third position P3 of the lower turning path 310b, and a fourth position P4 and a fifth position P5 of the ascending path 310c by the rotation of the vertical conveyor 310. Accordingly, the substrate 20 may obtain a soldering temperature profile corresponding to the temperature distribution of the first to third zones. A desired soldering temperature profile may be obtained while the substrate 20 on the substrate stage 200 moves through the first to third zones Z1, Z2 and Z3 with time.

After the substrate 20 is preheated in the third zone Z3, the substrate may be moved to the second zone Z2 and activated (soaked). The substrate 20 may be preheated to limit and/or prevent various soldering defects and to provide a more solid and conductive joint. There may be a secondary vapor phase which is produced at a cooler temperature than the main vapor layer in the third and second zones Z3 and Z2. No soldering takes place in this zone, only a temperature rises.

Then, the substrate may be moved to the first zone Z1 so that the solder 40 may be reflowed. When the substrate 20 is immersed in the vapor in the first zone Z1, the vapor may serve as a heat transfer medium. Since the temperature of the vapor and the temperature of the substrate 20 in the first zone Z1 are different from each other, vapor may condense on a surface of the substrate to form a layer. The vapor condensing on the surface may transfer latent heat to the surface of the substrate 20 during condensation to reflow a solder paste.

Then, after the solder 40 is soldered, the substrate 20 may move to the second zone Z2 and the third zone Z3 and then may be cooled. Accordingly, the solder joints may be cooled down and solidified.

The soldered substrate 20 may be moved upward to the unloading position Po of the ascending path 310*c* of the vertical conveyor 310, and the substrate 20 on the substrate stage 200 at the unloading position Po may be unloaded onto the second horizontal conveyors 152.

Referring to FIG. 17, a molding member 50 may be formed on the substrate 20 to cover the semiconductor chips 30 (S130).

In example embodiments, the molding member 50 may be formed on the substrate 20 by a transfer molding apparatus. The substrate 20 may be disposed in a molding space of a mold of the molding apparatus, and a sealing material may flow at high temperature and under high pressure when a lower mold and an upper mold are clamped, so that the liquid sealing material flows inside the molding space and is solidified to form the molding member covering the semiconductor chips 30. For example, the sealing material may include an epoxy mold compound (EMC).

Figure 18:
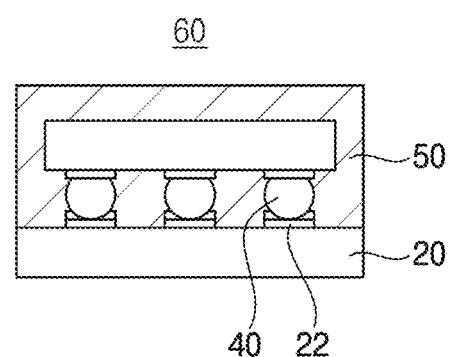

Referring to FIG. 18, the substrate 20 may be sawed by a sawing process to complete semiconductor packages 60.

In example embodiments, external connection members (not illustrated) such as solder balls may be formed on outer connection pads on a lower surface of the substrate 20, and the cutting region CR of the substrate 20 may be removed by a cutting device such as a blade. Accordingly, the semiconductor packages P may be individualized from the substrate 20.

Through the above processes, a semiconductor package including a logic device or a memory device and a semiconductor module including the same may be manufactured. The semiconductor package may include logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, ReRAM devices, or the like.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of embodiments of inventive concepts. Accordingly, all such modifications are intended to be included within the scope of example embodiments as defined in the claims.

What is claimed is:

1. A solder reflow apparatus, comprising:
a vapor generating chamber configured to accommodate a heat transfer fluid and to be filled with saturated vapor generated when the heat transfer fluid is heated;
a heater configured to heat the heat transfer fluid accommodated within the vapor generating chamber;
a vertical transfer portion including a vertical conveyor supported by a driving pulley and a driven pulley so as to be rotatable in an endless track, the vertical conveyor having a conveying route of a descending path and an ascending path in the vapor generating chamber; and
at least one substrate stage fixedly fastened to one side of the vertical conveyor by a fastening portion so as to be raised and lowered in the vapor generating chamber by rotation of the vertical conveyor, the at least one substrate stage being configured to support a substrate on which an electronic component is mounted via a solder,
wherein an inner space of the vapor generating chamber is divided into different zones according to a distribution of saturated vapor generated from the heat transfer fluid when the heat transfer fluid is heated,
the different zones in the vapor generating chamber have different temperatures, and
the vertical conveyor is configured to transport the at least one substrate stage along the conveying route through the different zones of the vapor generating chamber in a vertical direction, to thereby obtain a desired soldering temperature profile.

2. The solder reflow apparatus of claim 1, wherein
an upper wall of the vapor generating chamber has a first passage hole and a second passage hole that are spaced apart from each other, and
the vertical transfer portion is positioned so the vertical conveyor and the at least one substrate stage are allowed to pass through the first passage hole and the second passage hole as the driving pulley and the driven pulley are rotated.

3. The solder reflow apparatus of claim 1, wherein
the fastening portion includes a coupler and a support shaft,
the coupler is on the vertical conveyor,
the support shaft extends from the coupler in a first horizontal direction, and
the support shaft supports the at least one substrate stage by support rods.

4. The solder reflow apparatus of claim 3, wherein
the support shaft maintains the at least one substrate stage in a horizontal state when the at least one substrate stage moves upward and downward.

5. The solder reflow apparatus of claim 3, wherein the support shaft is rotatable with respect to a central axis of the support shaft.

6. The solder reflow apparatus of claim 1, further comprising:
a guide pulley, wherein
the guide pulley is rotatably installed to support a portion of the vertical conveyor in the vapor generating chamber, and
the guide pulley is configured to change at least one of the descending path and the ascending path.

7. The solder reflow apparatus of claim 6, wherein
the guide pulley is movable in the vertical direction or in a first horizontal direction, and
the first horizontal direction is perpendicular to the vertical direction.

8. The solder reflow apparatus of claim 1, further comprising:
a guide pulley, wherein
the vertical transfer portion includes two driven pulleys in the vapor generating chamber, the guide pulley is rotatably installed to support a portion of the vertical conveyor between the two driven pulleys and to change a lower turning path of the conveying route.

9. The solder reflow apparatus of claim 1, further comprising:
a first horizontal conveyor configured to load the substrate onto the at least one substrate stage on the descending path of the vertical conveyor; and
a second horizontal conveyor configured to unload the substrate from the at least one substrate stage on the ascending path of the vertical conveyor.

10. The solder reflow apparatus of claim 1, wherein
the substrate includes a package substrate, and
the electronic component includes a semiconductor chip.

11. A solder reflow apparatus comprising:
a vapor generating chamber configured to accommodate a heat transfer fluid on a bottom thereof;
a heater configured to heat the heat transfer fluid to generate saturated vapor from the heat transfer fluid;
at least one substrate stage configured to support a substrate having an electronic device mounted thereon via a solder;
a vertical transfer portion including a vertical conveyor supported by a driving pulley and a driven pulley so as to be rotatable in an endless track and have a conveying route including a descending path and an ascending path in the vapor generating chamber; and
a fastening portion configured to fixedly fasten the at least one substrate stage to one side of the vertical conveyor,
wherein an inner space of the vapor generating chamber is divided into different zones according to a distribution of the saturated vapor generated when the heat transfer fluid is heated,
the different zones in the vapor generating chamber have different temperatures, and
the vertical conveyor is configured to transport the at least one substrate stage along the conveying route through the different zones of the vapor generating chamber in a vertical direction, to thereby obtain a desired soldering temperature profile.

12. The solder reflow apparatus of claim 11, wherein
the fastening portion includes a coupler and a support shaft,
the coupler is on the vertical conveyor; and
the support shaft extends from the coupler in a first horizontal direction, and
the support shaft supports the at least one substrate stage by support rods.

13. The solder reflow apparatus of claim 12, wherein
the support shaft maintains the at least one substrate stage in a horizontal state when the at least one substrate stage moves upward and downward.

14. The solder reflow apparatus of claim 12, wherein the support shaft is rotatable with respect to a central axis of the support shaft.

15. The solder reflow apparatus of claim 11, further comprising:
a guide pulley, wherein
the guide pulley is rotatably installed to support a portion of the vertical conveyor in the vapor generating chamber, and
the guide pulley is configured to change at least one of the descending path and the ascending path.

16. The solder reflow apparatus of claim 15, wherein
the guide pulley is movable in the vertical direction or in a first horizontal direction, and
the first horizontal direction is perpendicular to the vertical direction.

17. The solder reflow apparatus of claim 11, further comprising:
a guide pulley, wherein
the vertical transfer portion includes two driven pulleys in the vapor generating chamber, and
the guide pulley is rotatably installed to support a portion of the vertical conveyor between the two driven pulleys and to change a lower turning path of the conveying route.

18. The solder reflow apparatus of claim 11, further comprising:
a first horizontal conveyor configured to load the substrate onto the at least one substrate stage on the descending path of the vertical conveyor; and
a second horizontal conveyor configured to unload the substrate from on the at least one substrate stage on the ascending path of the vertical conveyor.

19. The solder reflow apparatus of claim 11, wherein
the at least one substrate stage includes a plurality of substrate stages, and
the plurality of substrate stages are spaced apart from each other along an extending direction of the vertical conveyor.

20. A solder reflow apparatus, comprising:
a vapor generating chamber configured to accommodate a heat transfer fluid and a distribution of saturated vapor generated from the heat transfer fluid according to a density difference when the heat transfer fluid is heated;
a heater configured to heat the heat transfer fluid accommodated within the vapor generating chamber;
a vertical conveyor having a conveying route including a descending path and an ascending path within the vapor generating chamber;
a plurality of substrate stages fixedly fastened to the vertical conveyor, the plurality of substrate stages being movable upward and downward in the vapor generating chamber along the conveying route of the vertical conveyor, the plurality of substrate stages being spaced apart from each other along an extending direction of the vertical conveyor;
a fastening portion configured to fixedly fasten a corresponding one of the plurality of substrate stages to one side of the vertical conveyor, wherein
each of the plurality of substrate stages is configured to support a substrate on which an electronic component is mounted via a solder,
the fastening portion includes a support shaft, and
the support shaft is rotatable with respect to a central axis of the support shaft.

* * * * *